United States Patent
Ty Tan et al.

(10) Patent No.: US 7,764,852 B2
(45) Date of Patent: Jul. 27, 2010

(54) MICRORESONANTOR SYSTEMS AND METHODS OF FABRICATING THE SAME

(75) Inventors: Michael Renne Ty Tan, Menlo Park, CA (US); Shih-Yuan Wang, Palo Alto, CA (US); Duncan Stewart, Menlo Park, CA (US); David A. Fattal, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/888,015

(22) Filed: Jul. 30, 2007

(65) Prior Publication Data
US 2009/0034905 A1 Feb. 5, 2009

(51) Int. Cl.
*G02B 6/26* (2006.01)
(52) U.S. Cl. ............... 385/50; 385/14; 385/39
(58) Field of Classification Search ........... 385/50, 385/8, 14, 31, 32, 39–40, 129–132; 372/92–94
See application file for complete search history.

(56) References Cited

U.S. PATENT DOCUMENTS

| | | | |
|---|---|---|---|
| 5,652,556 A | 7/1997 | Flory | |
| 6,009,115 A * | 12/1999 | Ho | 372/92 |
| 6,110,814 A * | 8/2000 | Tokumasu et al. | 438/597 |
| 6,891,865 B1 * | 5/2005 | Ma | 372/20 |
| 6,959,123 B2 * | 10/2005 | Painter et al. | 385/1 |
| 2002/0114369 A1 * | 8/2002 | Kinoshita | 372/46 |
| 2003/0036217 A1 * | 2/2003 | Richard et al. | 438/98 |
| 2003/0058908 A1 * | 3/2003 | Griffel | 372/43 |
| 2003/0143771 A1 * | 7/2003 | Kidoguchi et al. | 438/46 |
| 2003/0202548 A1 | 10/2003 | Andersen | |
| 2003/0219045 A1 * | 11/2003 | Orenstein et al. | 372/20 |
| 2004/0008942 A1 | 1/2004 | Scheuer | |
| 2005/0074197 A1 * | 4/2005 | Tada et al. | 385/14 |
| 2005/0121678 A1 * | 6/2005 | Ezaki et al. | 257/79 |
| 2007/0071054 A1 * | 3/2007 | Takahashi | 372/50.1 |
| 2007/0170441 A1 * | 7/2007 | Takizawa et al. | 257/79 |
| 2007/0291273 A1 * | 12/2007 | Yokouchi et al. | 356/459 |

OTHER PUBLICATIONS

International Search report; PCT Patent Application No. PCT/US2008/009225, filed Jul. 30, 2008; search issued by Korean Patent Office (ISA).

* cited by examiner

*Primary Examiner*—Ellen Kim

(57) ABSTRACT

Various embodiments of the present invention are related to microresonator systems and to methods of fabricating the microresonator systems. In one embodiment, a microresonator system comprises a substrate having a top surface layer and at least one waveguide embedded in the substrate and positioned adjacent to the top surface layer of the substrate. The microresonator system also includes a microresonator having a top layer, an intermediate layer, a bottom layer, a peripheral region, and a peripheral coating. The bottom layer of the microresonator is attached to and in electrical communication with the top surface layer of the substrate. The microresonator is positioned so that at least a portion of the peripheral region is located above the at least one waveguide. The peripheral coating covers at least a portion of the peripheral surface and has a relatively lower index of refraction than the top, intermediate, and bottom layers of the microresonator.

12 Claims, 14 Drawing Sheets

MICRORESONANTOR SYSTEMS AND METHODS OF FABRICATING THE SAME

TECHNICAL FIELD

Embodiments of the present invention are directed to microresonator systems, and, in particular, to microresonator systems that can be used as lasers, modulators, and photodetectors and to the methods for fabricating these systems.

BACKGROUND

In recent years, the increasing density of microelectronic devices on integrated circuits has lead to a technological bottleneck in the density of metallic signal lines that can be used to interconnect these devices. In addition, the use of metallic signal lines yields a significant increase in power consumption and difficulties with synchronizing the longest links positioned on top of most circuits. Rather than transmitting information as electrical signals via signal lines, the same information can be encoded in electromagnetic radiation ("ER") and transmitted via waveguides, such as optical fibers, ridge waveguides, and photonic crystal waveguides. Transmitting information encoded in ER via waveguides has a number of advantages over transmitting electrical signals via signal lines. First, degradation or loss is much less for ER transmitted via waveguides than for electrical signals transmitted via signal lines. Second, waveguides can be fabricated to support a much higher bandwidth than signal lines. For example, a single Cu or Al wire can only transmit a single electrical signal, while a single optical fiber can be configured to transmit about 100 or more differently encoded ER.

Recently, advances in materials science and semiconductor fabrication techniques have made it possible to develop photonic devices that can be integrated with electronic devices, such as CMOS circuits, to form photonic integrated circuits ("PICs"). The term "photonic" refers to devices that can operate with either classically characterized ER or quantized ER with frequencies that span the electromagnetic spectrum. PICs are the photonic equivalent of electronic integrated circuits and may be implemented on a wafer of semiconductor material. In order to effectively implement PICs, passive and active photonic components are needed. Waveguides and attenuators are examples of passive photonic components that can typically be fabricated using conventional epitaxial and lithographic methods and may be used to direct the propagation of ER between microelectronic devices. However, these fabrication methods often produce defects in the photonic components that can result in significant channel loss. One common source of loss is scattering due to surface roughness.

FIG. 1 shows a top view of an example microdisk 102. In general, because a microdisk has a larger index of refraction than its surroundings, channels become trapped as a result of total internal reflection near the circumference of the microdisk and may be trapped within the microdisk. Modes of ER trapped near the circumference of the microdisk are called "whispering gallery modes ('WGMs')." A directional arrow 104 located near the circumference of microdisk 102 represents a hypothetical WGM propagating near the circumference of microdisk 102. Intensity plot 106 shows intensity of the WGM versus distance along line A-A of microdisk 102. Dashed-line intensity curves 108 and 110 show the WGM confined substantially to a peripheral region of microdisk 102. Portions of curves 108 and 110 that extend beyond the diameter of microdisk 102 represent evanescence of the WGM along the circumference of microdisk 102. However, enlargement 112 of an edge of microdisk 102 shows surface roughness which can be caused by an etching process used to form microdisk 102. This surface roughness increases scattering loss and reduces the Q factor of microdisk 102. Physicists and engineers have recognized a need for photonic components designs and fabrication methods that reduce scattering losses and increase Q factors associated with photonic components.

SUMMARY

Various embodiments of the present invention are related to microresonator systems and to methods of fabricating the microresonator systems. In one embodiment of the present invention, a microresonator system comprises a substrate having a top surface layer and at least one waveguide embedded in the substrate and positioned adjacent to the top surface layer of the substrate. The microresonator system also includes a microresonator having a top layer, an intermediate layer, a bottom layer, a peripheral region, and a peripheral coating. The bottom layer of the microresonator is attached to and in electrical communication with the top surface layer of the substrate. The microresonator is positioned so that at least a portion of the peripheral region is located above the at least one waveguide. The peripheral coating covers at least a portion of the peripheral surface and has a relatively lower index of refraction than the top, intermediate, and bottom layers of the microresonator.

BRIEF DESCRIPTION OF THE DRAWINGS

FIGS. 5A-5J show views that are associated with a method of fabricating the microresonator system, shown in FIG. 2, in accordance with embodiments of the present invention.

DETAILED DESCRIPTION

Figure 1:
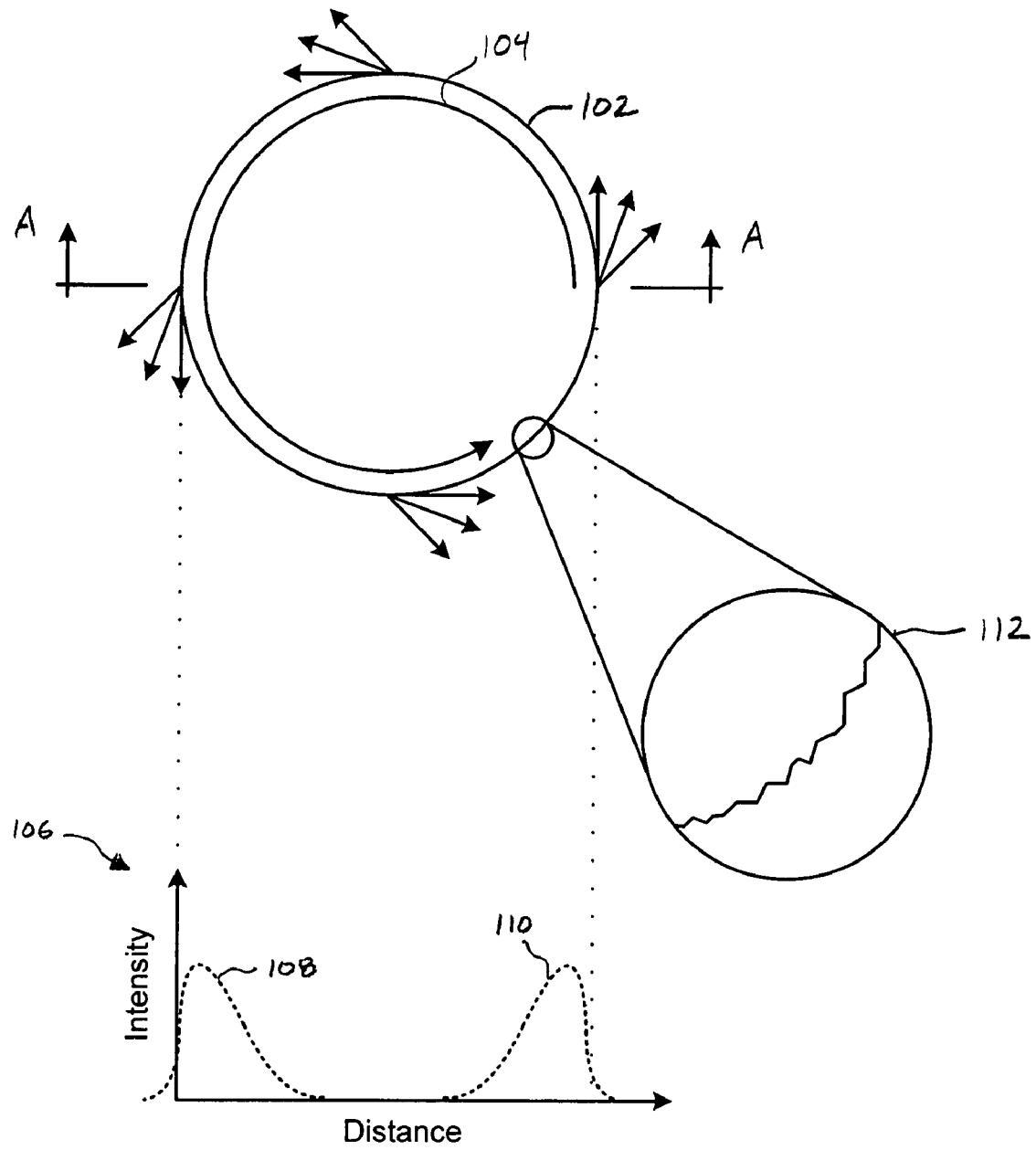
FIG. 1 shows a top view of an example microdisk.

Various embodiments of the present invention are directed to microscale resonator ("microresonator") systems and to methods of fabricating the microresonator systems. The microresonator systems may be used as lasers, modulators, and photodetectors and can be incorporated with CMOS circuitry. In the various microresonator and fabrication embodiments described below, a number of structurally similar components comprising the same materials have been provided with the same reference numerals and, in the interest of brevity, an explanation of their structure and function is not repeated.

Figure 2A:
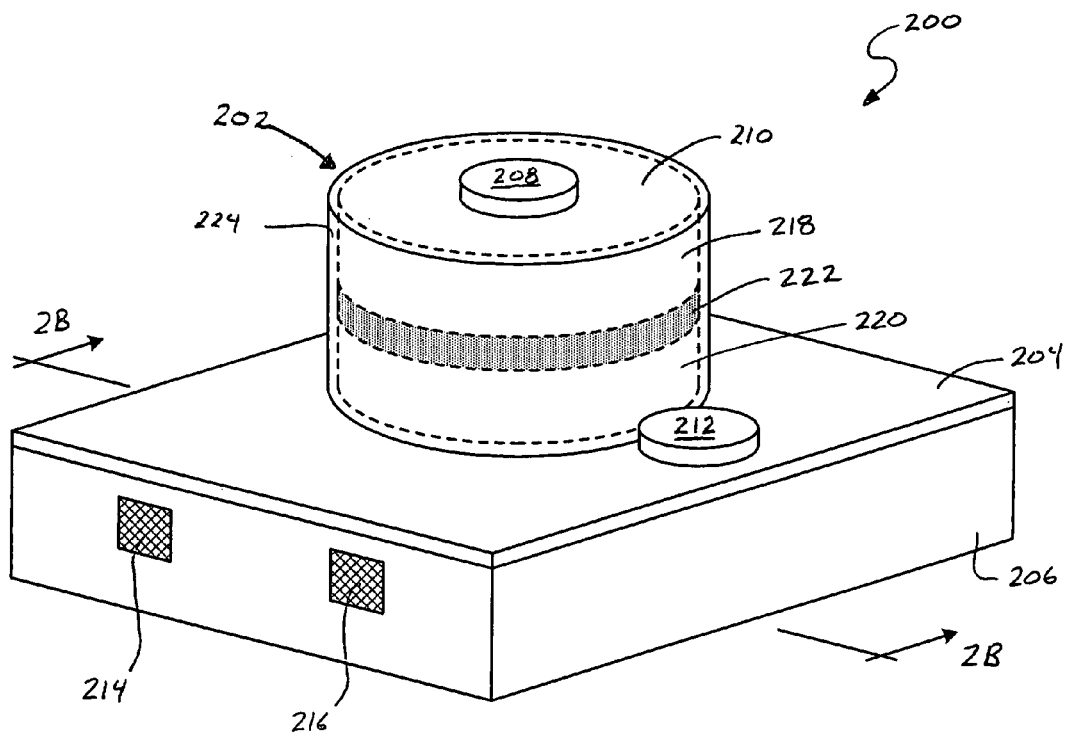
FIG. 2A shows an isometric view of a first microresonator system in accordance with embodiments of the present invention.

FIG. 2A shows an isometric view of a microresonator system 200 in accordance with embodiments of the present invention. Microresonator system 200 comprises a microdisk 202 attached to a top surface layer 204 of a substrate 206, a first electrode 208 adjacent to a top surface 210 of microdisk 202, and a second electrode 212 attached to top surface layer 204 and positioned adjacent to microdisk 202. Microdisk 202 is a microresonator of microresonator system 200 and can be configured to support certain WGMs. Substrate 206 includes two waveguides 214 and 216 that extend through substrate 206 and are positioned adjacent to top surface layer 204. Waveguides 214 and 216 are located beneath peripheral regions of microdisk 202. Microdisk 202 comprises a top layer 218, a bottom layer 220, and an intermediate layer 222 sandwiched between top layer 218 and bottom layer 220. Bottom layer 220 can be comprised of the same material as top surface layer 204, as described below with reference to FIG. 2B. Layers 218, 220, and 222 of microdisk 202 are described in greater detail below with reference to FIG. 3. Microresonator system 200 includes a relatively thin peripheral coating 224 covering at least a portion of the peripheral surface of microdisk 202.

Figure 2B:
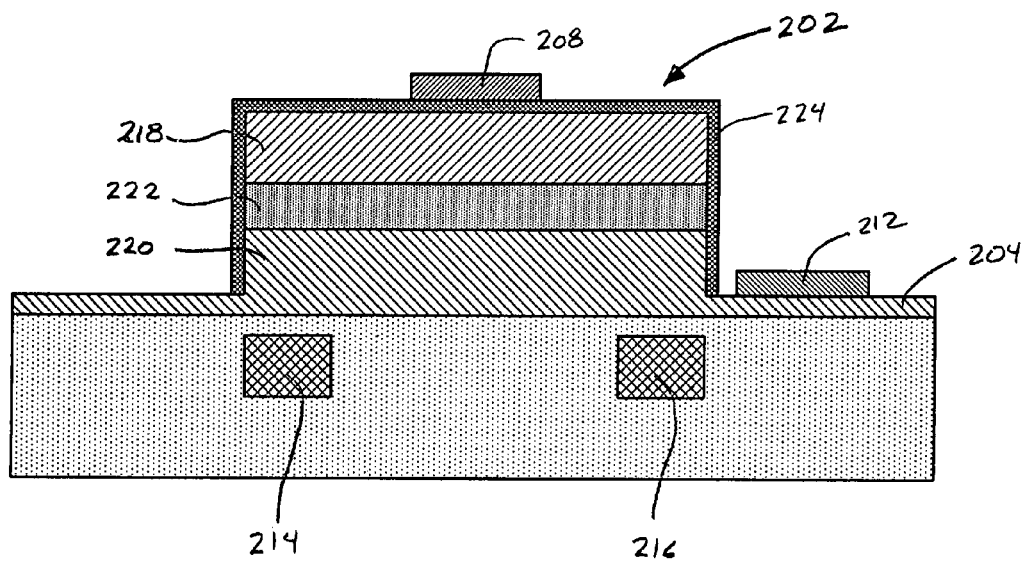
FIG. 2B shows a cross-sectional view of the first microresonator system along a line 2B-2B, shown in FIG. 2A, in accordance with embodiments of the present invention.

FIG. 2B shows a cross-sectional view of microresonator system 200 along a line 2B-2B, shown in FIG. 2A, in accordance with embodiments of the present invention. As shown in FIG. 2B, waveguides 214 and 216 are located beneath portions of peripheral regions of microdisk 202. Second electrode 212 is in electrical communication with bottom layer 220 via top surface layer 204. Although only a single second electrode 212 is positioned on top surface layer 204, in other embodiments of the present invention, two or more electrodes can be positioned on top surface layer 204.

Figure 3A:
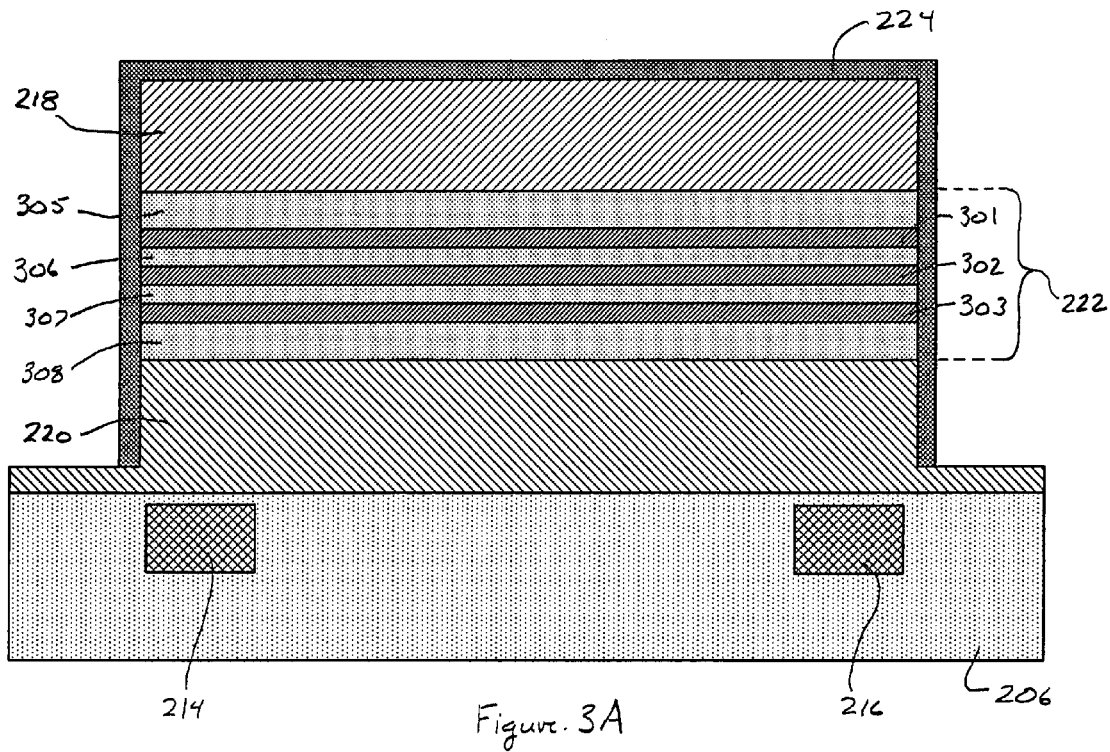
FIG. 3A shows a cross-sectional view of layers comprising an exemplary microdisk in accordance with embodiments of the present invention.

Top layer 218 can be a III-V semiconductor doped with electron donor impurities that produce a larger electron than hole concentrations. These semiconductors are referred to as "n-type semiconductors." Bottom layer 220 can be a III-V semiconductor doped with element acceptor impurities that produce a larger hole than electron concentration. The semiconductors are referred to as "p-type semiconductors." Note that Roman numerals III and V refer to elements in the third and fifth columns of the Periodic Table of the Elements. Intermediate layer 222 includes one or more quantum wells. Each quantum well can be a relatively thin, III-V semiconductor layer sandwiched between two layers of a different type of III-V semiconductor. FIG. 3A shows a cross-sectional view of layers comprising an exemplary microdisk 202 in accordance with embodiments of the present invention. In FIG. 3A, top layer 218 can be p-type InP, where Zn can be used as the dopant, and bottom layer 220 can be n-type InP, where Si can be used as the dopant. Intermediate layer 222 includes three quantum wells 301-303 of $In_xGa_{1-x}As_yP_{1-y}$, where x and y range between 0 and 1. Intermediate layer 222 also includes barrier layers 305-308 of $In_xGa_{1-x}As_yP_{1-y}$, where x and y range between 0 and 1. The choice of compositions x and y are well-known in the art. For example, for layers which are latticed matched to InP layers 218 and 220, the x value is chosen to be 0.47. The choice of y determines the bandgap energy of the quantum well. Operation of a quantum well is described below with reference to FIG. 6A. The quantum wells 301-303 can be configured to emit ER at a desired wavelength λ while the barrier layers 305-308 can be configured to have a relatively larger bandgap in order to confine carriers (i.e., electrons and holes) injected into the quantum well. Layers 306 and 307 separate quantum wells 301-303, and layers 305 and 308 are two relatively thicker layers that separate quantum wells 301 and 303 from layers 218 and 220, respectively. Peripheral coating 224 can be an un-doped phosphorus-based semiconductor, such as InP. Substrate 206 can be comprised of $SiO_2$, $Si_3N_4$ or another suitable dielectric insulating material. Waveguides 214 and 216 can be comprised of a column IV element, such as Si and Ge. In other embodiments of the present invention, other suitable III-V semiconductor, such as GaAs, GaP or GaN, may be used.

Figure 3B:
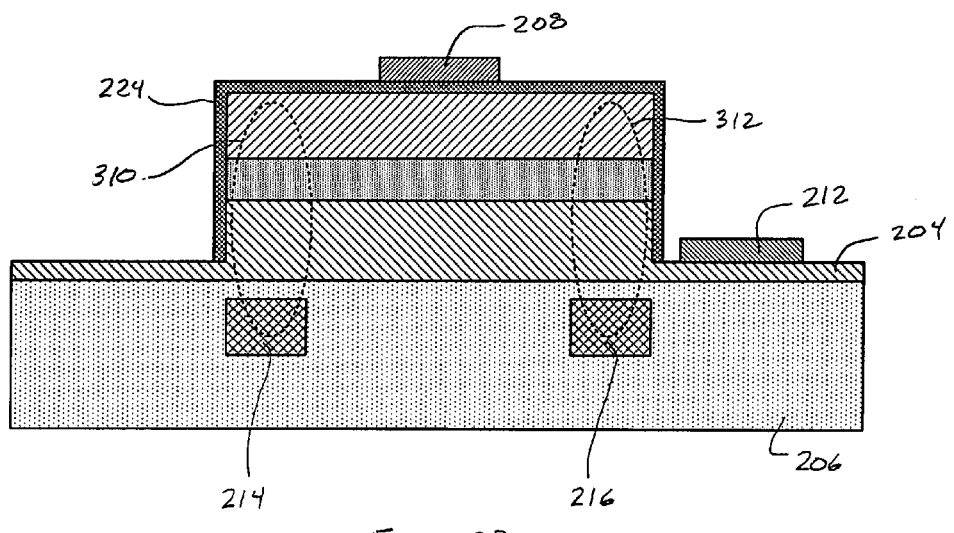
FIG. 3B shows a cross-sectional view of a whispering gallery mode located in a peripheral region of a microdisk in accordance with embodiments of the present invention.

The thickness of peripheral coating 224 can range from about 5 to about 25 nm or range from about 10 to about 20 nm and have a relatively lower index of refraction than the index of refraction associated with layers 218, 220, and 222 of microdisk 202. In addition, peripheral coating 224 also has a smoother outer surface than the outer surface of layers 218, 220, and 222. As a result, peripheral coating 224 serves as a cladding layer that also reduces the amount of loss due to scattering along the periphery of microdisk 202, which, in turn, results in a higher associated Q factor. FIG. 3B shows a cross-sectional view of a WGM located in a peripheral region of microdisk 202 in accordance with embodiments of the present invention. As shown in FIG. 3B, dashed-line ellipses 310 and 312 identify portions of the peripheral region of microdisk 202 occupied by a WGM and show evanescent coupling of the WGM into waveguides 214 and 216.

Figure 4A:
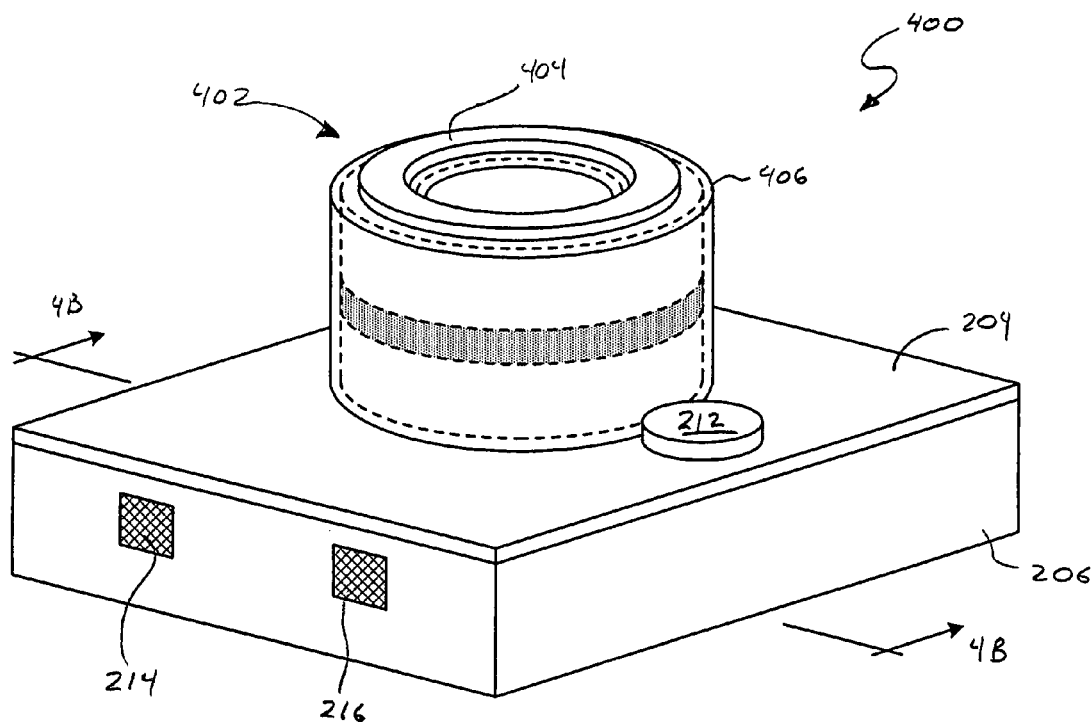
FIG. 4A shows an isometric view of a second microresonator system in accordance with embodiments of the present invention.

The microresonators of the microresonator system embodiments of the present invention are not limited to circular-shaped microdisks, such as microdisk 202. In other embodiments of the present invention, the microresonators can be microrings or other suitable microresonators, and the microresonators can be circular, elliptical, or have any other shape that is suitable for creating resonant ER. FIG. 4A shows an isometric view of a second microresonator system 400 in accordance with embodiments of the present invention. Microresonator system 400 comprises a microring 402 attached to top surface layer 204 of substrate 206 and is positioned so that portions of microring 402 are located above waveguides 214 and 216. A microring electrode 404 is located on the top surface of microring 402, and microring 402 comprises top, intermediate, and bottom layers having the same composition as layers 218, 220, and 222 of microdisk 202. The bottom layer of microring 402 may be comprised of the same material as top surface layer 204. Microresonator system 400 also includes a relatively thin peripheral coating 406 covering the peripheral surface of microring 402.

Figure 4B:
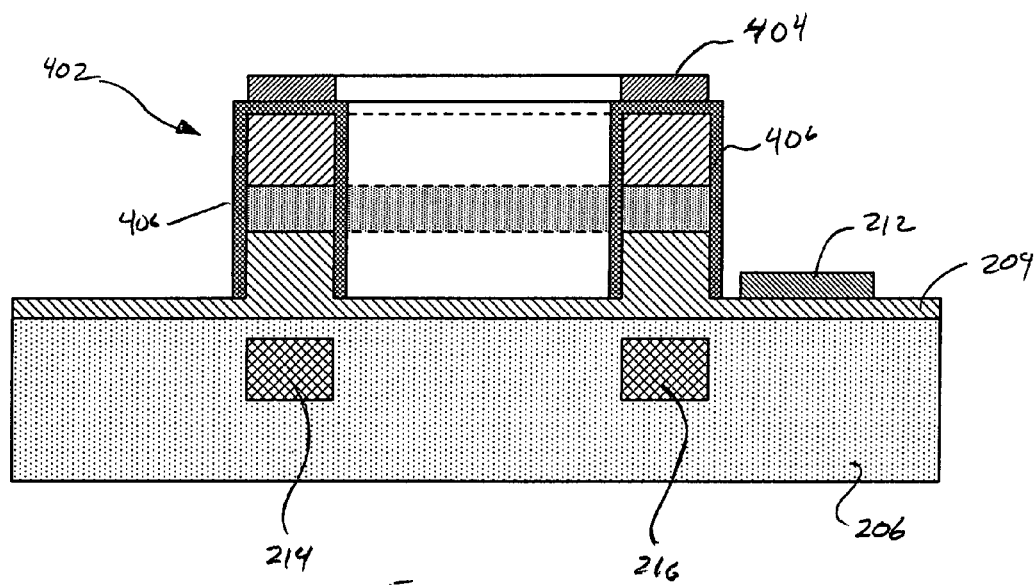
FIG. 4B shows a cross-sectional view of the second microresonator system along a line 4B-4B, shown in FIG. 4A, in accordance with embodiments of the present invention.

FIG. 4B shows a cross-sectional view of second microresonator system 400 along a line 4B-4B, shown in FIG. 4A, in accordance with embodiments of the present invention. As shown in FIG. 4B, waveguides 214 and 216 are located beneath portions of microring 402. Second electrode 212 is in electrical communication with the bottom layer of microring 402 via top surface layer 204. In other embodiments of the present invention, two or more electrodes can be positioned on top surface layer 204.

Figure 5A:
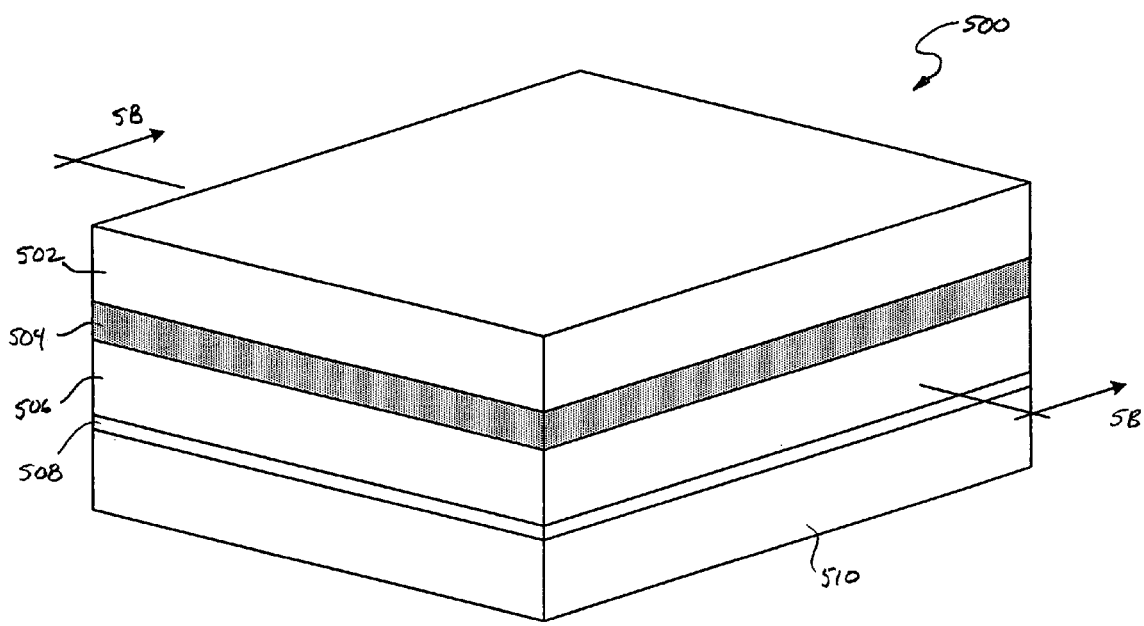
Figure 5B:
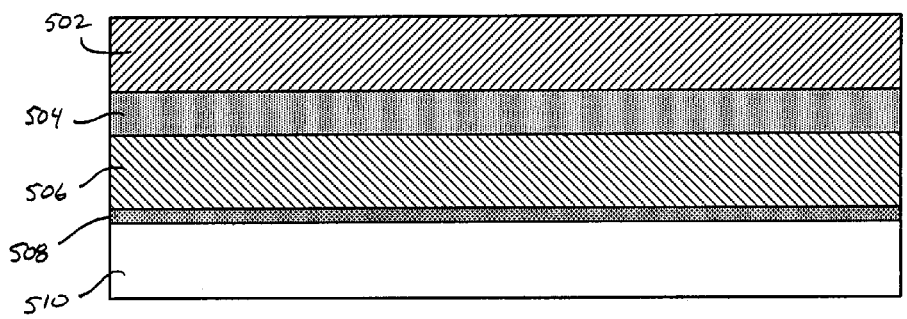

FIGS. 5A-5J show isometric and cross-sectional views that are associated with a method of fabricating photonic system 200, shown in FIG. 2, in accordance with embodiments of the present invention. FIG. 5A shows an isometric view of a first structure 500 comprising a top layer 502, an intermediate layer 504, a bottom layer 506, and an etch stop layer 508 supported by a phosphorus-based wafer 510. Layers 502 and 506 can be comprised of n-type and p-type III-V semiconductors, such as InP or GaP doped with Si and Zn, respectively. Intermediate layer 504 includes at least one quantum well, as described above with reference to FIG. 3. Etch stop layer 508 can be a thin layer of latticed matched $In_{0.53}Ga_{0.47}As$. Layers 502, 504, and 506 can be deposited using molecular beam expitaxy ("MBE"), liquid phase epitaxy ("LPE"), hydride vapor phase epitaxy ("HVPE"), metalorganic vapor phase expitaxy ("MOVPE"), or another suitable expitaxy method. FIG. 5B shows a cross-sectional view of layers 502, 504, 506, 508, and wafer 510.

Figure 5C:
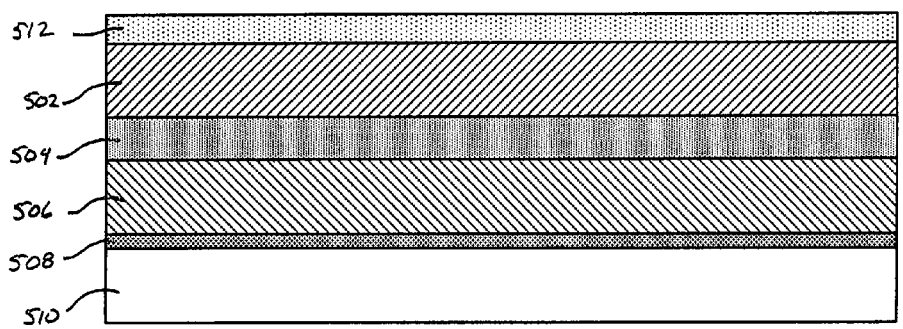

Next, as shown in the cross-sectional view of FIG. 5C, sputtering can be used to deposit an oxide layer 512 over top layer 502. Oxide layer 512 can be used to facilitate wafer bonding of top layer 502 onto substrate 206, as described below with reference to FIG. 5G. Layer 512 can be $SiO_2$, $Si_3N_4$, or another suitable dielectric material that substantially enhances wafer bonding to substrate 206.

Figure 5D:
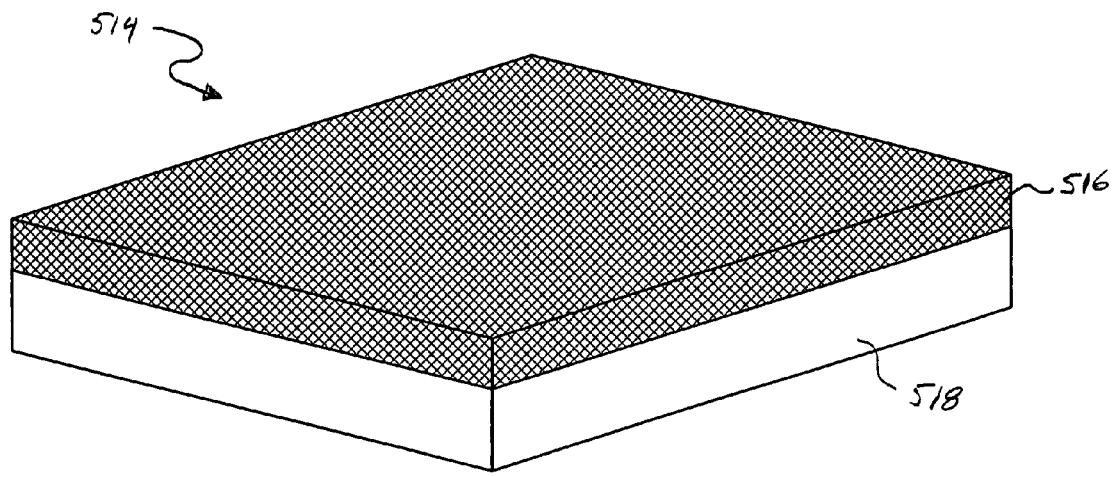
Figure 5E:
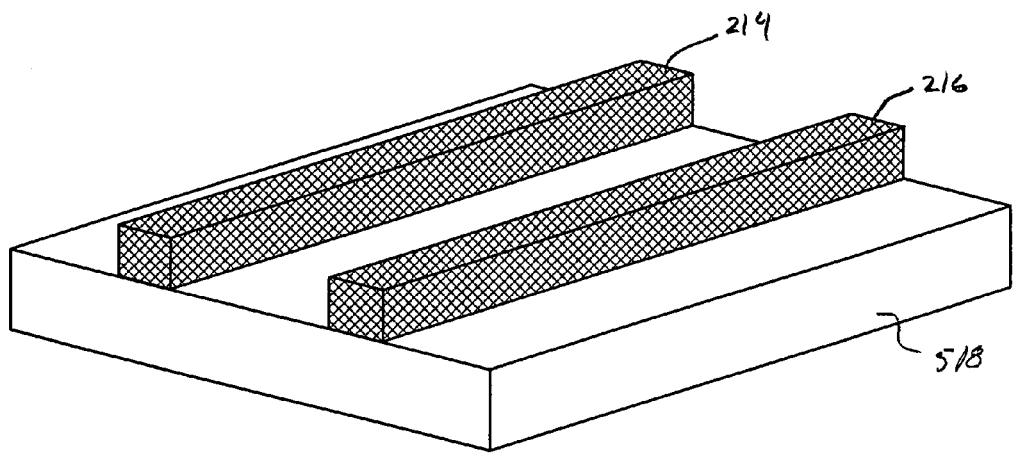
Figure 5F:
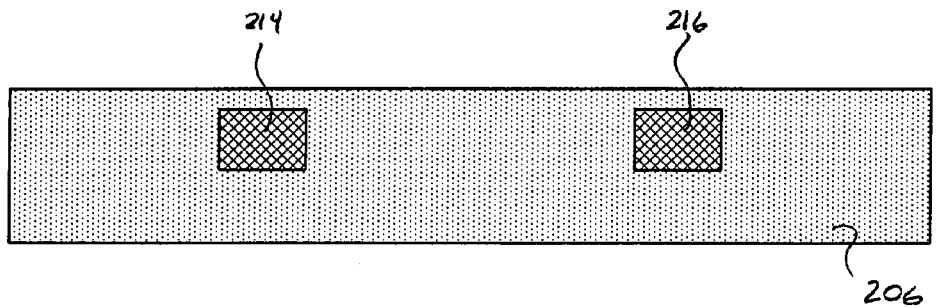

FIG. 5D shows a silicon-on-insulator substrate ("SOI") wafer 514 having a Si layer 516 on an oxide substrate layer 518. Silicon waveguides 214 and 216 can be fabricated in Si layer 516 as follows. A photoresist can be deposited over Si layer 516 and a photoresist mask of waveguides 214 and 216 can be patterned in the photoresist using UV lithography. Waveguides 214 and 216 can then be formed in Si layer 514 using a suitable etch system, such as inductively coupled plasma etcher ("ICP"), and a low-pressure, high-density etch system with a chemistry based on $Cl_2HBr/He/O_2$. After waveguides 214 and 216 have been formed in Si layer 516, a solvent can be used to remove the photoresist mask leaving waveguides 214 and 216, as shown in FIG. 5E. An oxide layer comprised of the same oxide material as substrate 518 can be deposited over waveguides 214 and 216 using liquid-phase, chemical-vapor deposition. Chemical mechanical polishing ("CMP") processes may be used to planarize the deposited oxide in order to form substrate 206 with embedded waveguides 214 and 216, as shown in the cross-sectional view of substrate 206 in FIG. 5F.

Figure 5G:
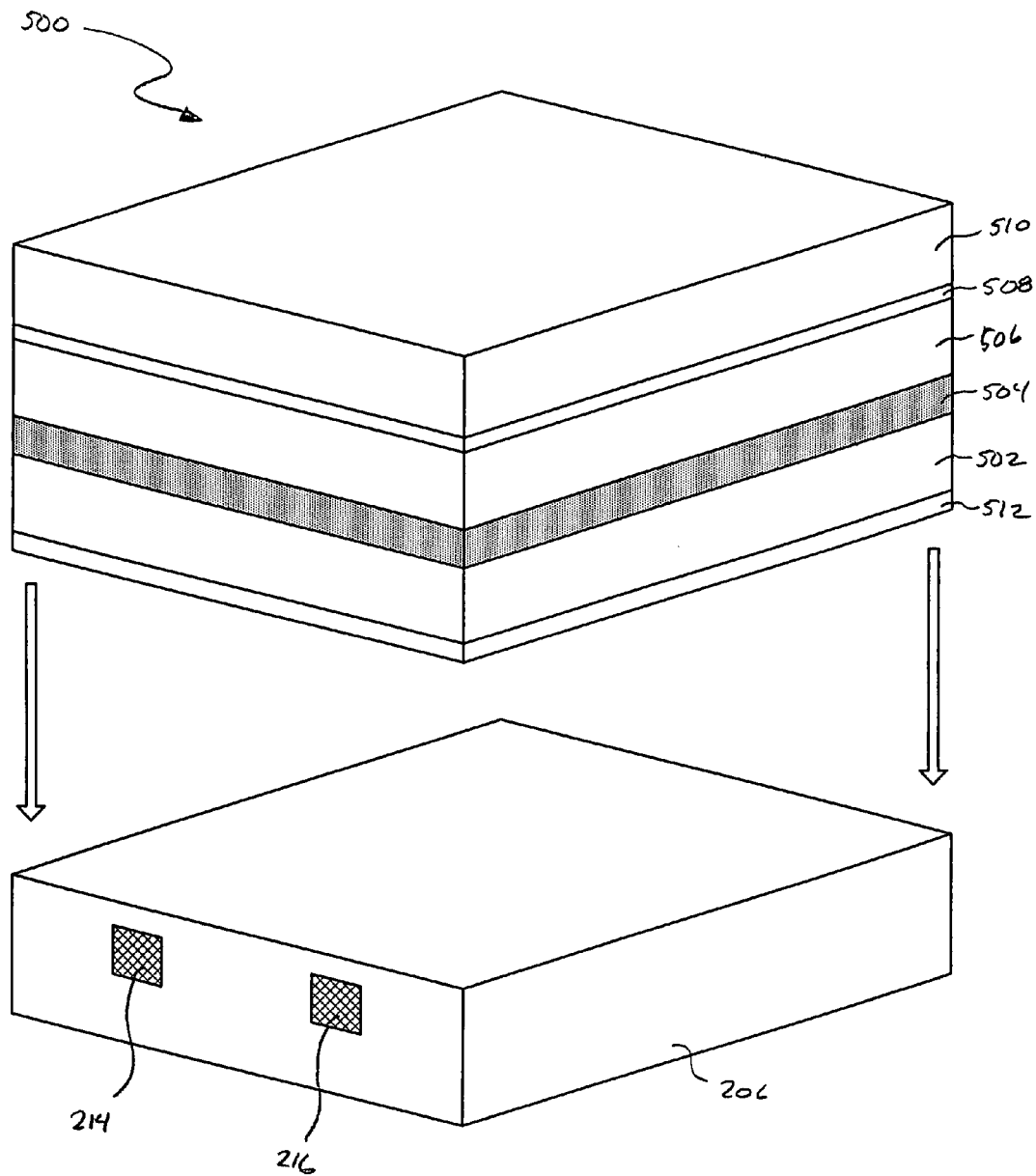
Figure 5H:
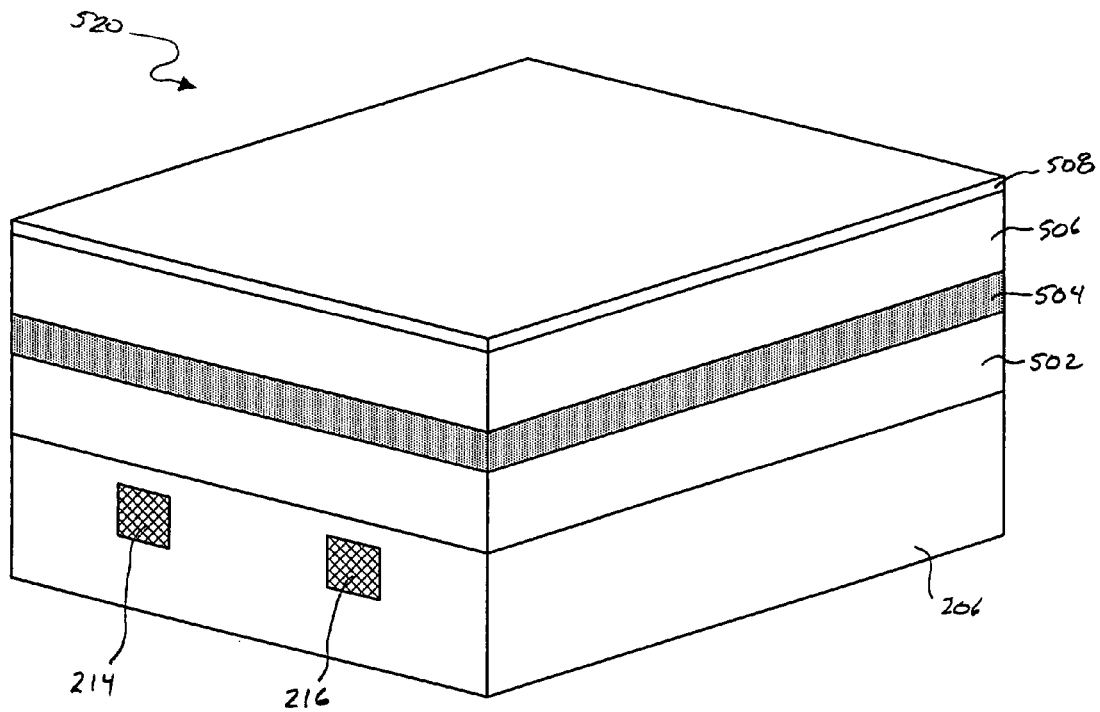

Next, as shown in FIG. 5G, first structure 500 is inverted and wafer bonding is used to attach oxide layer 512 to the top surface of substrate 206. Selective wet etching can be used to remove layer 510 in order to obtain a second structure 520 shown in FIG. 5H. Etch stop layer 508 can included to stop the etching process from reaching layer 506. Hydrochloric acid can also be used to remove an InP-based wafer 510 because there is an etch selectivity between the InP and the InGaAs of etch stop layer 508.

Figure 5I:
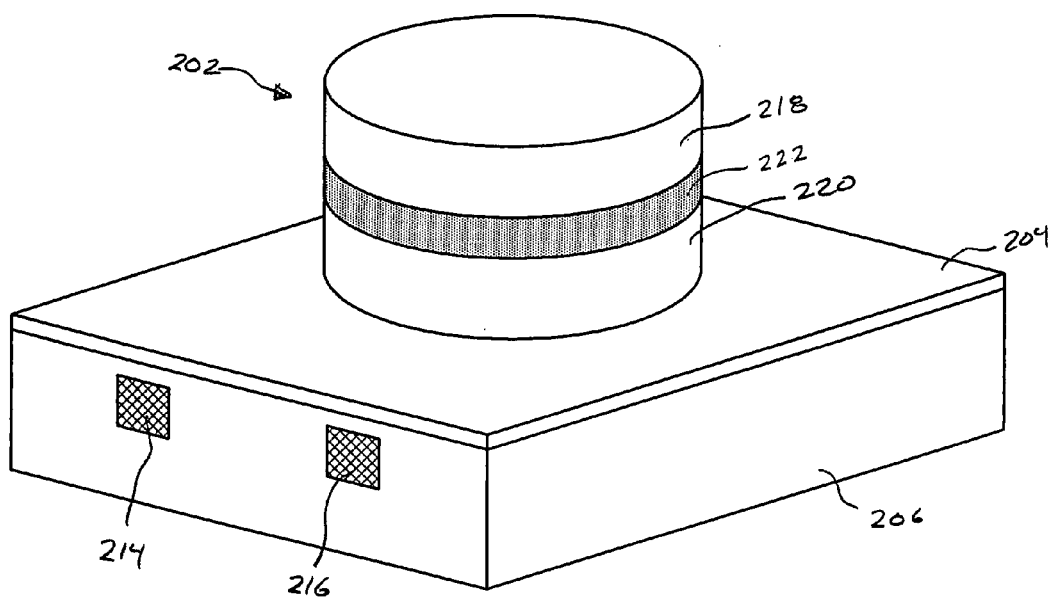
Figure 55:
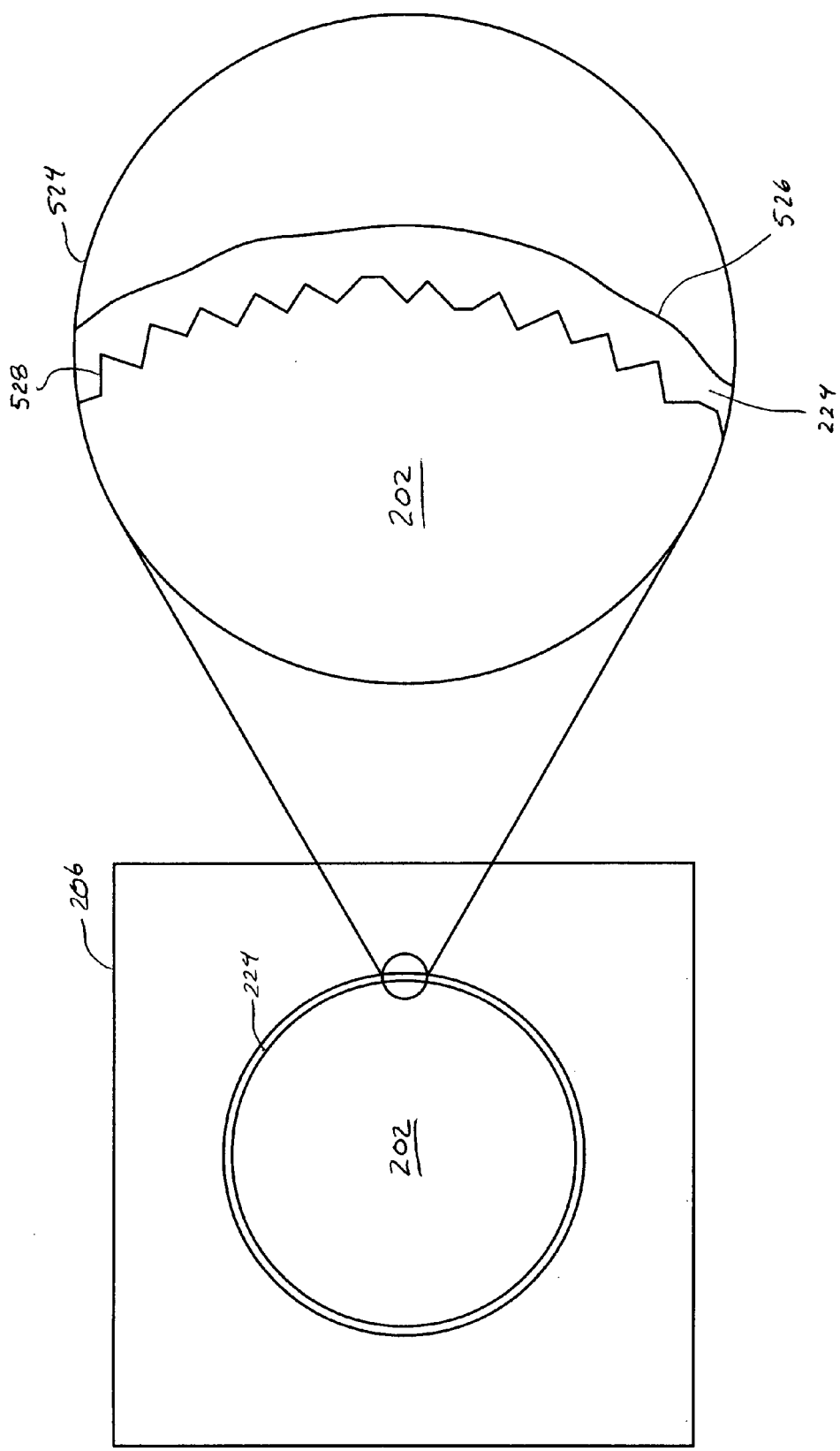

Next, reactive ion etching ("RIE"), chemically assisted ion beam etching ("CAIBE"), or inductively coupled plasma ("ICP") etching can be used to etch layers 502, 504, and 506 into the form of microdisk 202, as shown in FIG. 5I. Note RIE, CAIBE, and ICP can also be used to form a microring as shown in FIG. 4 or another suitable microresonator shape. A portion of layer 502 adjacent to substrate 206 is left in order to from top surface layer 204. The resulting microdisk 202 structure has a rough outer surface resulting from the etching process. The dry etch process causes a thin damaged region on the surface of microdisk 202 due to bombarding of the surface of microdisk 202 with reactive elements. This damaged and roughened outer surface of layers 218, 220, and 222 causes excess loss and a lower Q of ER confined to these layers. Mass transport process is used to smooth out this rough surface while annealing out the damage.

After microdisk 202 is formed by etching, microdisk 202 and substrate 206 are placed in a reaction chamber filled with a suitable partial pressure of phosphine gas ($PH_3$) and hydrogen $H_2$, and the chamber is heated to a temperature ranging from about 400° C. to about 700° C. Indium atoms in layers 218, 220, and 222 become dissociated and through mass transport are able to react with phosphorus in the phosphine gas at the outer surface of microdisk 202 forming a relatively thin peripheral coating 224 of InP covering the outer surface of microdisk 202. Mass transport results in the erosion of sharp convex surfaces and the filling in of concave surfaces due to surface energy minimization and diffusion.

FIG. 5J shows peripheral coating 224 covering microdisk 202 in accordance with embodiments of the present invention. Peripheral coating 224 may have a thickness ranging from about 5 nm to about 25 nm or from about 10 nm to about 20 nm and may serve as a cladding layer because the index of refraction of peripheral coating 224 is relative lower than the index of refraction of the layers comprising microdisk 202. In addition, as shown in an enlargement 524 of the outer surface of microdisk 202, peripheral coating 224 provides a smoother outer surface 526 that reduces the amount of scattering created by rough outer surface 528 and increases the Q factor associated with microdisk 202. The mass transported InP in peripheral coating 224 has a wider bandgap than the quantum wells of quantum well layer 222 and reduces loss due to surface recombination of the carriers at the defects on the etched surface of microdisk 202. This "heterointerface" introduces a built in field which prevents the injected carriers from reaching the surface of microdisk 202.

Microdisk 202 can be used as a laser that generates coherent ER transmitted in waveguides 214 and 216. A laser comprises three basic components: a gain medium or amplifier, a pump, and feedback of the ER inside an optical cavity. The quantum wells of intermediate layer 222 comprise the gain medium, an externally applied current or voltage to electrodes 208 and 212 is the pump, and feedback is created by total internal reflection as a WGM generated by pumping quantum wells of intermediate layer 222 propagates near the circumference of microdisk 202.

Figure 6A:
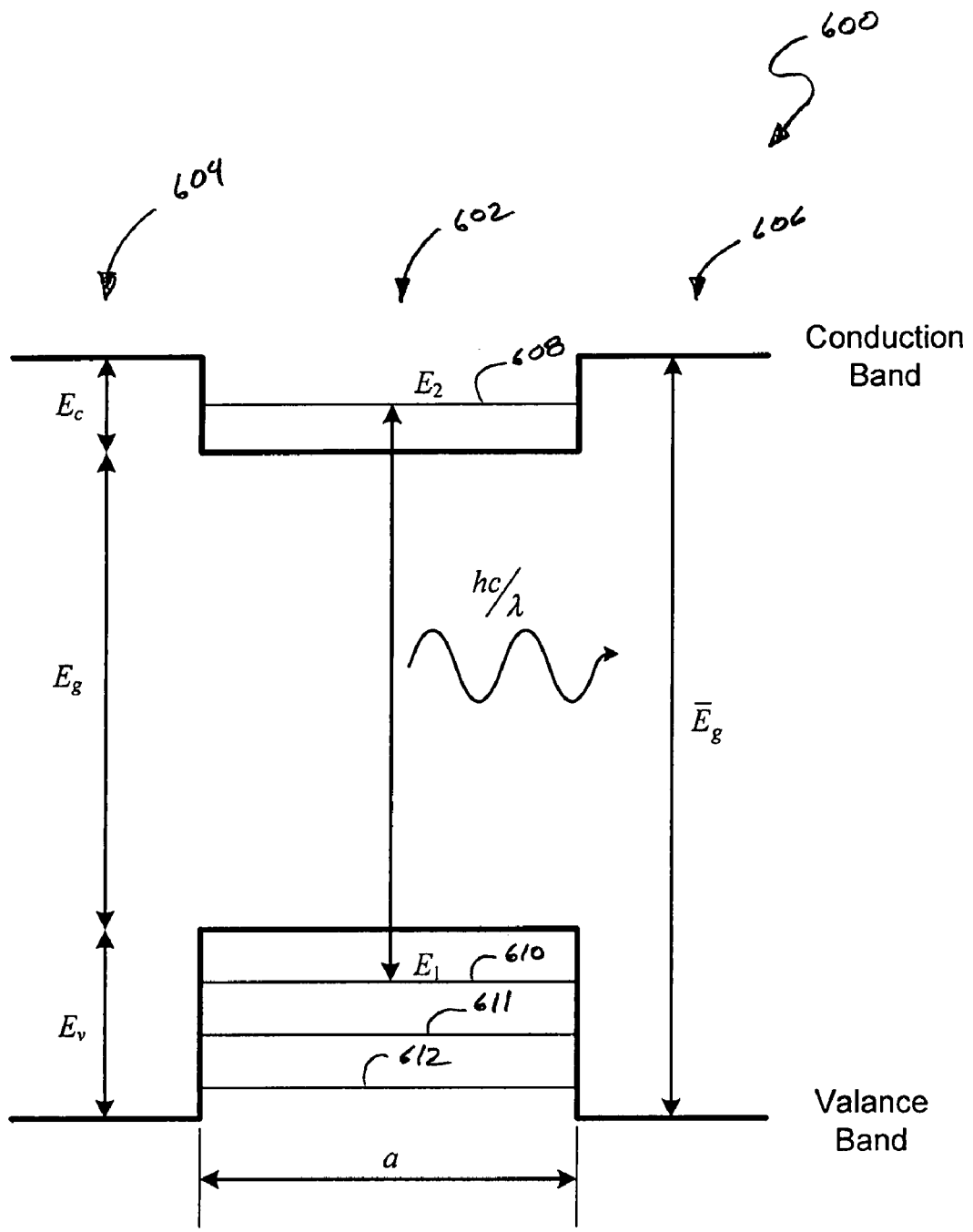
FIG. 6A shows an energy level diagram associated with electronic states of a quantum-well gain medium.
Figure 7A:
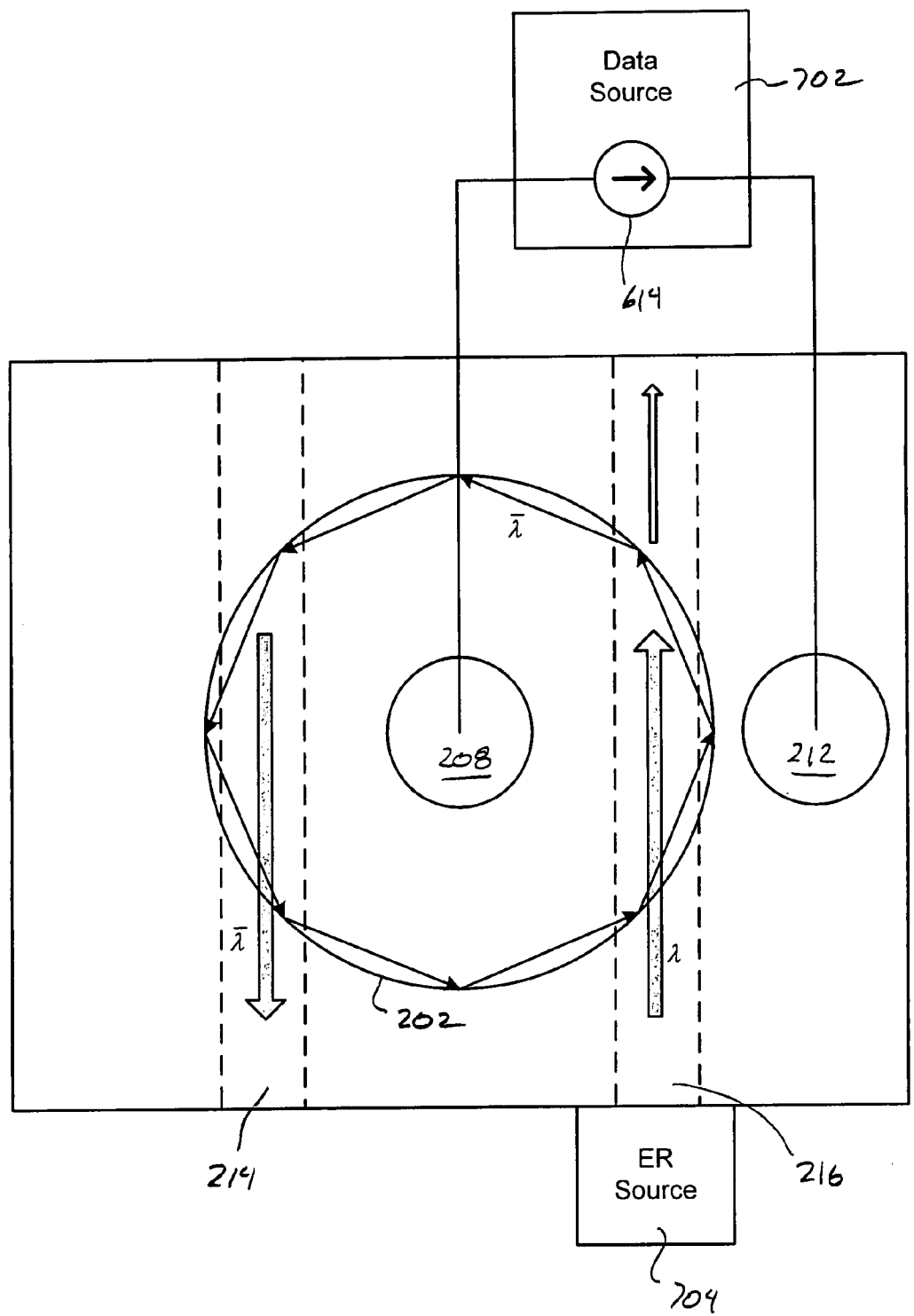
FIG. 7A shows a schematic representation of the microresonator system, shown in FIG. 2, operated as a modulator in accordance with embodiments of the present invention.

A gain medium can be comprised of at least one quantum well with a suitable bandgap. The quantum well size and the bulk material surrounding the quantum well determine the energy level spacing of electronic states in the quantum well. Typically, the quantum well is configured to have a relatively small number of quantized electronic energy levels in the valance band and a few quantized hole energy levels in the conduction band. Electrons transitioning from the lowest energy levels in the conduction band to energy levels in the valance band determine the emission wavelength $\lambda$ of the gain medium. FIG. 6A shows an energy level diagram 600 associated with quantized electronic energy states of a quantum well-based gain medium of width $\alpha$. Narrower region 602 with bandgap energy $E_g$ corresponds to a quantum well, and relatively wider regions 604 and 606 with bandgap energy $\overline{E}_g$ correspond to bulk material surrounding the quantum well. As shown in FIG. 7A, the quantum well has a hole energy level 608 in the conduction band and three electronic energy levels 610-612 in the valence band. Because the gain medium comprises semiconductor material, an appropriate electronic stimulus, such as electrical pumping, promotes electrons from the valance band into the quantized levels in the conduction band, such as hole energy level 608. Spontaneous recombination of an electron in the conduction with a hole in the valance band results in emission of a photon having an energy given by hc/λ, where h is Plank's constant, and c is the speed of ER in a vacuum. A stimulated emission occurs as a result of photons in the WGM stimulating the gain medium to generate more photons at the same energy or wavelength. In both spontaneous and stimulated radiative emissions, the energy of the ER emitted is:

$$E_2 - E_1 = \frac{hc}{\lambda}$$

where $E_2$ is the energy level 608 of the electrons that have been pumped into the conduction band, and $E_1$ is the energy level 610 associated with holes in the valance band that combine with electron from the conduction band. As long as the electrical pump is applied to the gain medium, feedback caused by total internal reflection within microdisk 202 causes the intensity of the WGM to increase. Lasing occurs when the gain equals the loss inside microdisk 202. Microdisk 202 forms the optical cavity with gain, and the waveguides 214 and 216 couple the ER out of microdisk 202.

Figure 6B:
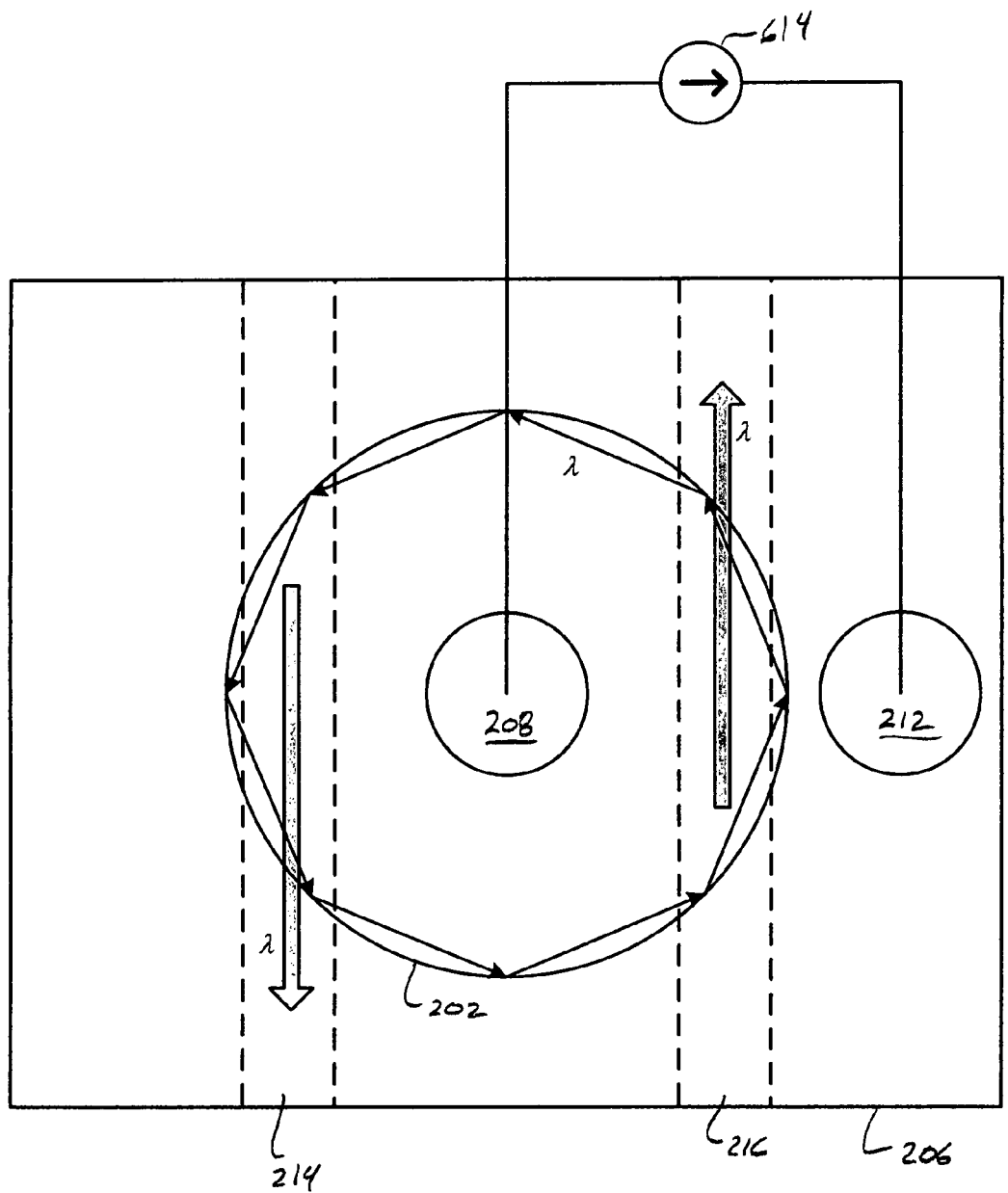
FIG. 6B shows a schematic representation of the microresonator system, shown in FIG. 2, operated as a laser in accordance with embodiments of the present invention.

FIG. 6B shows a schematic representation of the microresonator system 200, shown in FIG. 2, operated as a laser in accordance with embodiments of the present invention. As shown in FIG. 6B, first and second electrodes 208 and 212 are connected to a current source 614. Quantum-wells of microdisk 202 can be operated as a gain medium by pumping microdisk 202, as described above with reference to FIG. 6A, with a current of an appropriate magnitude supplied by current source 614. As a result, a WGM having a wavelength λ is generated within microdisk 202, and total internal reflection causes the WGM to propagate near the circumference of microdisk 202 as the intensity of the WGM increases. The WGM evanescently couples into the waveguides 214 and 216 yielding ER with a wavelength λ that propagates in waveguides 214 and 216.

Figure 7B:
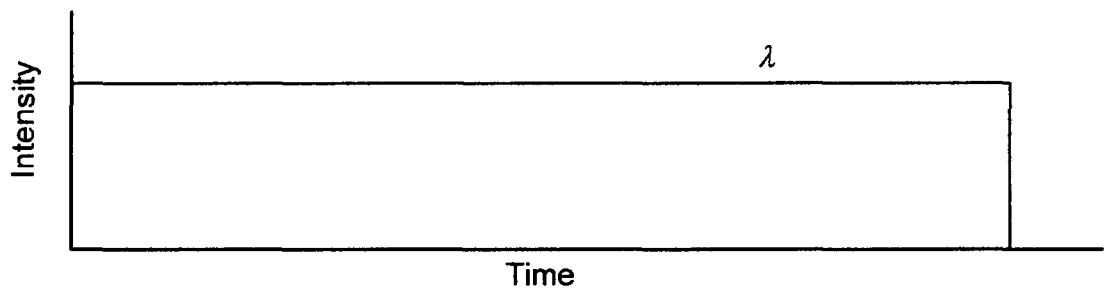
FIG. 7B shows a plot of intensity versus time of electromagnetic radiation emitted from a source in photonic communication with the microresonator system shown in FIG. 7A.

FIG. 7A shows a schematic representation of the microresonator system 200, shown in FIG. 2, operated as a modulator in accordance with embodiments of the present invention. Current source 614 is connected to a data source 702, which can be a central processing unit, memory, or another data generating device. ER source 704 is coupled to waveguide 216 and emits ER with a substantially constant intensity over time, as shown in FIG. 7B. Returning to FIG. 7A, the amount of ER coupled into microdisk 202 depends on the detuning, the coupling coefficient, and the losses inside of microdisk 202. When the wavelength λ of the ER emitted by source 704 is detuned from the resonance of microdisk 202, the ER does not couple from waveguide 216 into microdisk 202. When the wavelength λ of the ER is at resonance with microdisk 202, the transmission of the ER propagating in the waveguide 216 is reduced because the ER is evanescently coupled into microdisk 202 creating a WGM. A portion of the ER transmitted in waveguide 216 evanescently couples into the peripheral region of microdisk 202 located above waveguide 216 and propagates in the peripheral region as a WGM with a wavelength λ. Data source 702 encodes data in the WGM by modulating the magnitude of the current generated by current source 614. Modulating the magnitude of the current transmitted between electrodes 208 and 212 causes the index of refraction of microdisk 202 to correspondingly change. When the index of refraction of microdisk 202 is changed, the resonant wavelength of microdisk 202 changes causing a detuning from the resonant wavelength of ER transmitted in waveguide 216. This in turn modulates the transmission of ER from waveguide 216 into microdisk 202 and subsequently modulates the intensity of the ER transmitted in waveguide 216. When waveguide 214 is present, ER can be transferred to waveguide 214 from the input waveguide 216 via microdisk 202. The amount of ER transferred to waveguide 214 depends on the coupling strength. Modulating the index of refraction of microdisk 202 results in a reduction in the intensity of the ER transmitted to waveguide 214. One can also modulate the intensity of the ER in waveguide 216 by adjusting the loss inside microring 202. This is accomplished by using the quantum confined stark effect which modulates the bandgap of the quantum well through the application of an applied voltage. Increasing the loss in microdisk 202 modulates the intensity transmitted past microdisk 202 in waveguides 214 and 216.

Figure 7C:
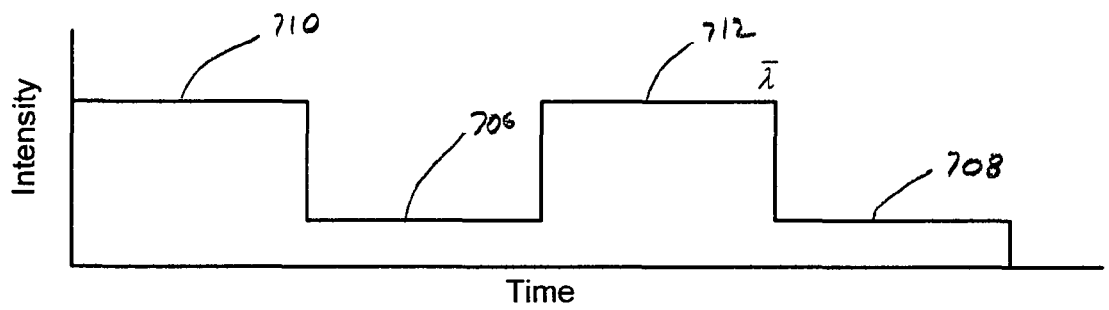
FIG. 7C shows intensity versus time of modulated electromagnetic radiation generated by the microresonator system shown in FIG. 2.

FIG. 7C shows intensity versus time of modulated ER where relatively lower intensity regions 706 and 708 correspond to a relatively higher index of refraction induced on microdisk 202. The relative intensities can be used to encode information by assigning a binary number to the relative intensities. For example, the binary number "0" can be represented in a photonic signal by low intensities, such as intensity regions 706 and 708, and the binary number "1" can be represented in the same photonic signal by relatively higher intensities, such as intensity regions 710 and 712.

Figure 8:
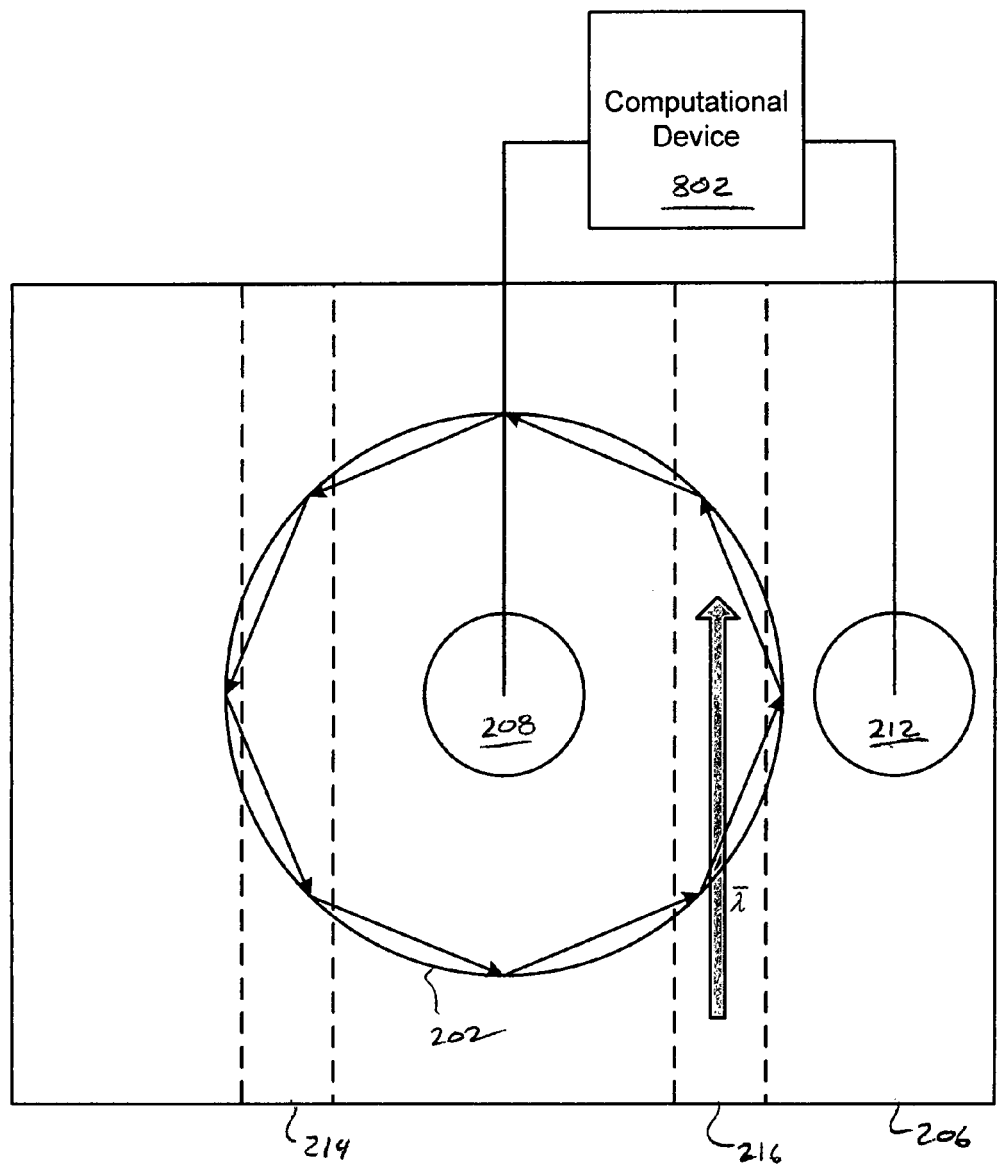
FIG. 8 shows a schematic representation of the microresonator system, shown in FIG. 2, operated as a photodetector in accordance with embodiments of the present invention.

FIG. 8 shows a schematic representation of the microresonator system 200, shown in FIG. 2, operated as a photodetector in accordance with embodiments of the present invention. Modulated ER $\overline{\lambda}$ encoding information is transmitted in waveguide 216. The ER evanescently couples into the peripheral region of microdisk 202 producing a corresponding modulated WGM. Fluctuations in the intensity of WGMs induces a corresponding fluctuating current between first and second electrodes 208 and 212. The fluctuating current is an electrical signal encoding the same data encoded in the modulated ER, which can be processed by computational device 802.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A microresonator system comprising:
   a substrate having a top surface layer;
   at least one waveguide embedded within the substrate and positioned adjacent to the top surface layer of the substrate; and a microresonator having a top layer, an intermediate layer, a bottom layer, a peripheral region, and a peripheral coating, wherein the bottom layer of the microresonator is attached to and in electrical communication with the top surface layer of the substrate, the microresonator is positioned so that at least a portion of the peripheral region is located above the at least one waveguide, and the peripheral coating covers at least a portion of the peripheral surface and has a relatively lower index of refraction than the top, intermediate, and bottom layers of the microresonator.

2. The system of claim 1 further comprising:
a first electrode positioned on the top surface layer of the microresonator; and
at least one second electrode positioned on the top surface layer of the substrate adjacent to the microresonator.

3. The system of claim 1 wherein the intermediate layer further comprises at least one quantum well.

4. The system of claim 1 wherein the top layer further comprises a p-type semiconductor and the bottom layer further comprise an n-type semiconductor.

5. The system of claim 1 wherein the peripheral coating further comprises a phosphorus-based semiconductor.

6. The system of claim 1 wherein the microresonator further comprises one of:
a microdisk; and
a microring.

7. The system of claim 1 wherein the peripheral coating serves as a cladding layer for the microresonator.

8. A microresonator comprising:
a top layer;
a bottom layer;
an intermediate layer having one or more quantum wells, the intermediate layer sandwiched between and in contact with the top layer and the bottom layer; and
a peripheral coating covering the top surface of the top layer and covering peripheral surfaces of the top layer, the bottom layer, and the intermediate layer, the peripheral coating having a relatively lower index of refraction than the top layer, the bottom layer, and the intermediate layer.

9. The microresonator of claim 8 wherein the top layer further comprises p-type semiconductor and the bottom layer further comprise an n-type semiconductor.

10. The microresonator of claim 8 wherein the peripheral coating further comprises a phosphorus-based semiconductor.

11. The microresonator of claim 8 wherein the peripheral coating serves as a cladding layer.

12. The microresonator of claim 8 further comprises one of:
a microdisk; and
a microring.

* * * * *

UNITED STATES PATENT AND TRADEMARK OFFICE
CERTIFICATE OF CORRECTION

PATENT NO.        : 7,764,852 B2
APPLICATION NO.   : 11/888015
DATED             : July 27, 2010
INVENTOR(S)       : Michael Renne Ty Tan et al.

It is certified that error appears in the above-identified patent and that said Letters Patent is hereby corrected as shown below:

On the Title page, in field (54), Title, in column 1, line 1, delete "MICRORESONANTOR" and insert -- MICRORESONATOR --, therefor.

In column 1, line 1, delete "MICRORESONANTOR" and insert -- MICRORESONATOR --, therefor.

Signed and Sealed this
Fifteenth Day of February, 2011

David J. Kappos
*Director of the United States Patent and Trademark Office*